United States Patent
Kobayashi et al.

(10) Patent No.: US 12,105,160 B2
(45) Date of Patent: Oct. 1, 2024

(54) MAGNETO-OPTICAL MATERIAL AND METHOD FOR PRODUCING SAME

(71) Applicant: RESEARCH INSTITUTE FOR ELECTROMAGNETIC MATERIALS, Tomiya (JP)

(72) Inventors: Nobukiyo Kobayashi, Tomiya (JP); Tadayoshi Iwasa, Tomiya (JP); Kenji Ikeda, Tomiya (JP); KenIchi Arai, Tomiya (JP)

(73) Assignee: Research Institute For Electromagnetic Materials, Miyagi (JP)

( * ) Notice: Subject to any disclaimer, the term of this patent is extended or adjusted under 35 U.S.C. 154(b) by 0 days.

(21) Appl. No.: 18/019,543

(22) PCT Filed: Jul. 7, 2022

(86) PCT No.: PCT/JP2022/026985
§ 371 (c)(1),
(2) Date: Feb. 3, 2023

(87) PCT Pub. No.: WO2023/021877
PCT Pub. Date: Feb. 23, 2023

(65) Prior Publication Data
US 2024/0069124 A1 Feb. 29, 2024

(30) Foreign Application Priority Data
Aug. 20, 2021 (JP) ................................. 2021-134657

(51) Int. Cl.
*G01R 33/032* (2006.01)
*G02F 1/09* (2006.01)
*H01F 1/00* (2006.01)

(52) U.S. Cl.
CPC ........... *G01R 33/0322* (2013.01); *G02F 1/09* (2013.01); *H01F 1/0063* (2013.01)

(58) Field of Classification Search
CPC ....... G01R 33/0322; G02F 1/09; G02F 1/093; H01F 1/0063; H01F 10/123; H01F 10/205

(Continued)

(56) References Cited

U.S. PATENT DOCUMENTS 5,483,161 A * 1/1996 Deeter ............... G01R 33/0322
250/225
6,623,857 B2 9/2003 Watanabe et al.
(Continued)

FOREIGN PATENT DOCUMENTS

JP H0677081 A * 3/1994
JP 2001-273622 A 10/2001
(Continued)

OTHER PUBLICATIONS

JP Pat # 2017098423, see translation. (Year: 2017).*
(Continued)

*Primary Examiner* — Christopher P Mcandrew
(74) *Attorney, Agent, or Firm* — Carrier, Shende & Associates P.C.; Fulchand P. Shende; Joseph P. Carrier

(57) ABSTRACT

An object of the present invention is to provide a magneto-optical material capable of exhibiting the Faraday effect even though no magnetic field is applied. The magneto-optical material of the present invention has a nanogranular structure in which magnetic nanoparticles are dispersed in a fluoride matrix, and can exhibit Faraday properties without requiring the application of a magnetic field because the magnetic nanoparticles are configured by a magnetic mate- (Continued)

rial that has residual magnetization and consists of any of a Fe—Pt alloy, a Co—Pt alloy, a Fe—Co—Ni—Al alloy, a Co ferrite, or a Ba ferrite.

3 Claims, 15 Drawing Sheets

(58) Field of Classification Search
USPC .................................................. 324/1
See application file for complete search history.

(56) References Cited

U.S. PATENT DOCUMENTS

| | | | |
|---|---|---|---|
| 2010/0264913 A1* | 10/2010 | Sandhu | G01R 33/0213 324/214 |
| 2012/0052286 A1 | 3/2012 | Norwood et al. | |
| 2013/0038324 A1* | 2/2013 | Wu | G01R 33/032 324/244.1 |

FOREIGN PATENT DOCUMENTS

| | | | | |
|---|---|---|---|---|
| JP | 2003-099920 A | | 4/2003 | |
| JP | 2005-194591 A | | 7/2005 | |
| JP | 2014-175617 A | | 9/2014 | |
| JP | 2017-041599 A | | 2/2017 | |
| JP | 2017098423 A | * | 6/2017 | |
| JP | 2018-206978 A | | 12/2018 | |
| JP | 6619216 B2 | | 12/2019 | |
| JP | 2020-031084 A | | 2/2020 | |
| JP | 2020-088078 A | | 6/2020 | |
| WO | 2011/016891 A2 | | 2/2011 | |
| WO | WO-2012121111 A1 | * | 9/2012 | ........... C01B 19/007 |

OTHER PUBLICATIONS

S. Mitani et al., "Tunnel-Type Giant Magnetoresistance in Insulating Granular Systems. Higher-Order Spin-Dependent Tunneling", Materia; Journal vol. 37; Journal Issue:9, published Sep. 20, 1998, pp. 745-748.

Office Action dated Apr. 18, 2023 issued in the corresponding Japanese Patent Application No. 2021-134657.

Kobayashi et al., "FeCo—BaF and FeCo—SiN nanogranular films exhibiting giant Faraday effect", The transactions of the Institute of Electrical Engineers of Japan A, (A publication of Fundamentals and Materials Society), The Institute of Electrical Engineers of Japan, Feb. 1, 2021, vol. 131, No. 2, pp. 123-127.

* cited by examiner

MAGNETO-OPTICAL MATERIAL AND METHOD FOR PRODUCING SAME

TECHNICAL FIELD

The present invention relates to a magneto-optical material having a nanogranular structure.

BACKGROUND ART

The applicant of the present application has proposed a magneto-optical material having a nanogranular structure in which nanometer-sized magnetic metal granules are dispersed in a fluoride matrix (for example, refer to Patent Literature 1). This magneto-optical material has a high Faraday rotation angle and good translucency, and exhibits excellent magneto-optical properties in the near-infrared wavelength region, and thus is applicable to various optical communication devices.

CITATION LIST

Patent Literature

Patent Literature 1: Japanese Patent No. 6619216

Non Patent Literature

Non Patent Literature 1: Japan Institute of Metals Bulletin "Materia" Vol. 37 (1998), No. 9, p. 745-748, Tunnel-type Giant Magnetoresistance in Granular Systems—Higher Order Spin-Dependent Tunnel Effect

SUMMARY OF INVENTION

Technical Problem

However, in order for the magneto-optical material to exhibit the Faraday effect or the magneto-rotatory effect, it is necessary to apply a magnetic field to the magneto-optical material. For this reason, the scope of application of magneto-optical materials to optical communication devices is limited accordingly.

An object of the present invention is to provide a magneto-optical material capable of exhibiting the Faraday effect even though no magnetic field is applied, and a method for producing the same.

Solution to Problem

The magneto-optical material of the present invention has a nanogranular structure in which nanoparticles are dispersed in a matrix, wherein the matrix is a fluoride matrix containing at least one element selected from the group consisting of Li, Be, Mg, Al, Si, Ca, Sr, Ba, Bi, and rare earth elements, and the nanoparticles are magnetic nanoparticles having at least one residual magnetization selected from the group consisting of a Fe—Pt alloy, a Co—Pt alloy, a Fe—Co—Ni—Al alloy, a Co ferrite, and a Ba ferrite, and consisting of a Fe—Pt ordered phase, a $Co_3$—Pt ordered phase, or a spinel phase.

In addition, according to the magneto-optical material of the present invention, the absolute value of the Faraday rotation angle accompanying magnetization is 0.08 [deg./µm] or more in a state of no magnetic field applied.

A method for producing the magneto-optical material of the present invention includes:

a step of producing a nanogranular material having a nanogranular structure in which the magnetic nanoparticles are dispersed in the fluoride matrix; and a step of heat-treating the nanogranular material in a temperature range in which the magnetic nanoparticles form a Fe—Pt ordered phase, a Co—Pt ordered phase, or a spinel phase.

Advantageous Effects of Invention

According to the magneto-optical material of the present invention, the Faraday effect can be exhibited even though no magnetic field is applied, due to the residual magnetization of the magnetic nanoparticles.

DESCRIPTION OF EMBODIMENTS

Figure 1:
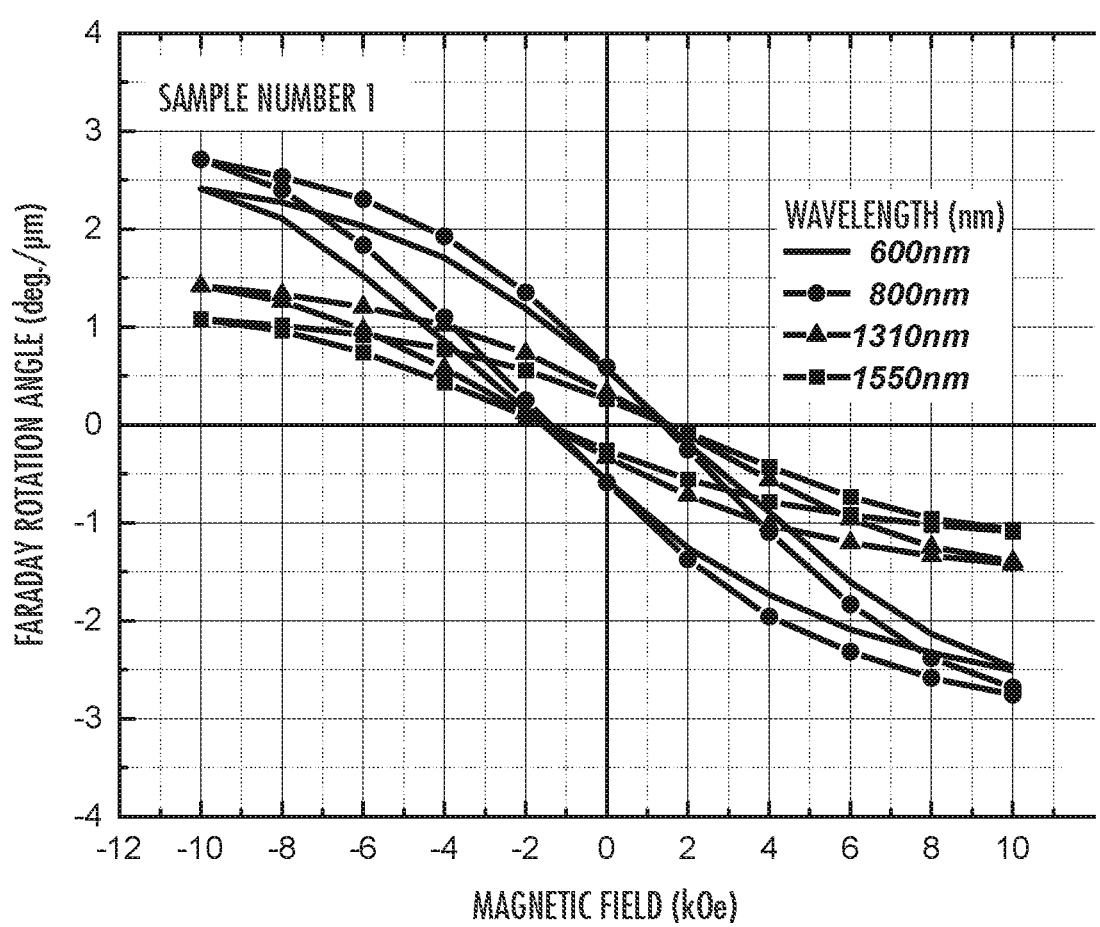
FIG. 1 shows a view of the Faraday loop of sample 1.

The present inventors have performed extensive investigations to obtain a magneto-optical material that has high magnetization properties and good translucency, exhibits excellent magneto-optical properties in the near-infrared region, and is applicable to various optical communication devices. As a result, researchers including some of the present inventors have found that among the nanogranular magnetic materials proposed as giant magnetoresistance (GMR) materials (refer to Non-Patent Literature 1), a material composed of a fluoride matrix and nm-sized metal granules has high magnetization properties and good translucency, and exhibits excellent magneto-optical properties in the near-infrared region due to the effect of fine magnetic metal granules present in a dispersed state in a translucent matrix.

The following is a description of the "composition and structure", "characteristics", and "production method" of the magneto-optical material according to the present invention.

(Composition and Structure)

The magneto-optical material of the present invention has a nanogranular structure in which magnetic nanoparticles (nanogranules) are dispersed in a fluoride matrix. The magnetic nanoparticles are configured by any magnetic material having residual magnetization of a Fe—Pt alloy, a Co—Pt alloy, a Fe—Co—Ni—Al alloy, a Co ferrite, and a Ba ferrite. The matrix is a fluoride containing at least one element selected from Li, Be, Mg, Al, Si, Ca, Sr, Ba, Bi, and rare earth elements.

The magneto-optical material of the present invention has a nanogranular structure in which magnetic granules having an average particle size of 50 nm or less are uniformly distributed in a fluoride matrix. The effect of the fine magnetic granules present in a dispersed state in the fluoride having excellent optical transparency provides a magneto-optical material having excellent properties. That is, magnetic nanoparticles having an average particle diameter of 50 nm or less are dispersed in fluoride, thereby allowing to simultaneously exhibit magnetism due to the magnetic granules and optical transparency due to the matrix. Such a nanogranular structure can be obtained by forming a thin film having the above composition by a thin deposition technique such as sputtering.

The volume ratio of all magnetic nanoparticles contained in the nanogranular structure to the matrix is preferably 10% or more and 50% or less. The magnetic nanoparticles having the volume ratio of less than 10% lose the magnetism due to the small amount of the magnetic component contained therein, and no longer function as a magnetic material. In contrast, when the volume ratio of magnetic nanoparticles is more than 50%, the amount of the magnetic component contained therein increases, the particle size of the magnetic nanoparticles exceeds 50 nm since adjacent magnetic nanoparticles contact and bond with each other, and incident light transmitted through the matrix fluoride is blocked by the magnetic nanoparticles, leading to loss of the optical transparency.

The magnetic nanoparticles are composed of a Fe—Pt alloy, a Co—Pt alloy, a Fe—Ni—Al alloy, a Co ferrite, and a Ba ferrite magnets having coercive force and residual magnetization, and desirably have as large residual magnetization as possible. By using a magnetic material, the magneto-optical material of the present invention can have magnetization even though no magnetic field is applied, and can exhibit the Faraday effect associated with residual magnetization. In order for magnetic nanoparticles to exhibit magnet properties with residual magnetization, they need to be crystals with ordered phases or spinel phases that have undergone optimal heat treatment. Heat treatment in a magnetic field (cooling in a magnetic field) is also effective for imparting magnetic anisotropy.

The magneto-optical material according to the present invention may be a thin film or a bulk material as long as it has the above composition, but a thin film is suitable for miniaturization of optical communication devices.

(Characteristics)

The following is a description of the properties of the magneto-optical material according to the present invention.

(1. Optical Transparency)

The magneto-optical material according to the present invention has a light transmittance of 1% or more per 1 μm thickness, preferably 10% or more per 1 μm thickness of the magnetic material for incident light of optional wavelength in the ultraviolet to near-infrared region, including the visible light region with a wavelength of 400 nm to 2000 nm. The magneto-optical material according to the present invention has good optical transparency over such a wide range, and thus becomes suitable for various optical communication devices.

(2. Magnetic Properties)

The magneto-optical material according to the present invention exhibits ferromagnetism with residual magnetization. The magneto-optical material according to the present invention exhibits the Faraday effect associated with spontaneous magnetization even though no magnetic field is applied, due to the presence of magnetic nanoparticles consisting of a magnetic material having residual magnetization. The use of the magneto-optical material according to the present invention eliminates a need for a magnetic field applying mechanism for exhibiting the Faraday effect, allowing the device structure to be simplified and miniaturized and allowing the device manufacturing process to be simplified. This also makes it possible to reduce the cost of the device.

(3. Magneto-Optical Properties: Faraday Rotation Angle)

In optical communication devices such as optical isolators and optical circulators, there are used magnetic materials exhibiting a magneto-optical effect (Faraday effect) in which the plane of polarization rotates when linearly polarized light parallel to a magnetic field is transmitted. However, the use of yttrium garnet or bismuth-substituted garnet conventionally used as such a magnetic material causes the Faraday rotation angle to become significantly small in the near-infrared wavelength region (1550 nm) used for optical communication. In contrast, the magneto-optical material of the present invention exhibits the absolute value of the Faraday rotation angle of 0.1 [deg./μm] or more, or further 0.3 [deg./μm] or more without depending on a wavelength region, allowing a larger Faraday rotation angle to be obtained as compared with a case where conventional yttrium garnet or bismuth-substituted garnet is used, in the near-infrared wavelength region (1550 nm) used for optical communication. Such a large Faraday rotation angle obtained is considered to be due to the magneto-optical effect of ferromagnetic metals by light transmission or reflection in fine magnetic granules, or the actions of electromagnetic effect and quantum effect at the interface between the matrix and magnetic granules.

(Production Method)

The magneto-optical material of the present invention can be deposited as a thin film by a conventional sputtering device or RF sputtering device. Using a sputtering method or a RF sputtering deposition device, disk targets of pure Fe, pure Co, pure Ni, and/or an alloy including any of Fe, Co, Ni, Pt, Al and Ba therewith, or even a composite target having Pt, Al and/or Ba chips evenly arranged on the metal disk targets is sputtered simultaneously with a fluoride target, thereby providing a nanogranular structure film in which nm-sized (50 nm or less) magnetic nanoparticles are dispersed in a fluoride matrix. In this case, as a base for thin film formation, in addition to various substrates such as semiconductor substrates and/or insulator substrates, substrates having a semiconductor and/or insulator layer formed on the surface thereof may be used.

Specifically, using a conventional type RF sputtering device, a RF magnetron sputtering device, or a DC facing target sputtering device, disk targets with a diameter of 70 to 100 mm of pure Fe, pure Co, pure Ni, and/or an alloy including any two or more of Fe, Co, Ni, Pt, Al, and Ba, or even an alloy target further including one or more elements selected from the group consisting of Li, Be, Mg, Al, Si, Ca, Sr, Ba, Bi, and rare earth elements is sputtered simultaneously with a fluoride target of one or more elements selected from the group consisting of Li, Be, Mg, Al, Si, Ca, Sr, Ba, Bi, and rare earth elements, thereby producing a nanogranular thin film having a nanogranular structure. Ar gas or a mixed gas of Ar and $O_2$ (0.1 to 10%) is used for the sputtering deposition. The film thickness is controlled by adjusting the deposition time, and the film is formed to a thickness of about 0.3 to 5 [μm]. The base (substrate) is indirectly water-cooled or controlled at an optional temperature within the temperature range of 100 to 800 [° C.], the sputtering pressure during deposition is controlled to 1 to 60 mTorr, and the sputter power is adjusted within the range of 50 to 350 [W].

(Heat Treatment)

In order for magnetic nanoparticles to exhibit magnetic properties accompanied by residual magnetization, magnetic nanoparticles need to have an ordered phase or a spinel phase. In order to obtain an ordered phase and a spinel phase, a heating step such as a predetermined heat treatment is required after deposition. The temperature required for this is 500° C. or more, and heat treatment is performed at a predetermined temperature within the temperature range of 500° C. to 800° C. in vacuum or in an oxygen atmosphere.

The magneto-optical material of the present invention obtained as a thin film by the above method is a nanogranular structure composed of a fluoride matrix and nm-sized magnetic metal nanoparticles, and has high magnetization properties and good translucency due to the effect of magnetic nanoparticles with fine residual magnetization present in a dispersed state in the translucent matrix. In addition, since the magneto-optical material of the present invention has a large Faraday rotation angle (for example, 0.08 deg./μm or more) associated with residual magnetization in all or a part of the wavelength band of 600 to 1600 nm in a state of no magnetic field applied, it can enable various optical communication devices to be simplified and miniaturized.

The production by the sputtering method is suitable for producing a thin film material with a film thickness of about 10 μm or less, whereas an electrochemical reaction deposition method using an aqueous solution containing elements to be synthesized is suitable for producing a thick film of more than 10 μm. Furthermore, for the production of bulk, there is a method of pulverizing and mixing powdery raw materials containing the elements to be synthesized and then sintering them.

EXAMPLES

Examples of the present invention will be described below.

(1. Preliminary Experiment)

The substrates used were about 0.5 mm thick #7059, #2000, #XG (trade name of Corning Incorporated) glasses manufactured by Corning Incorporated, a 0.5 mm thick Si wafer with the surface thermally oxidized, and a 0.5 mm thick quartz glass.

(2. Production and Evaluation of Thin Film)

Table 1 summarizes an example of conditions for producing thin film samples.

TABLE 1

| | |
|---|---|
| deposition apparatus | RF magnetron sputtering apparatus, DC facing target sputtering apparatus |
| Substrate | #2000 glass, quartz glass, Si wafer |
| Film thickness of thin-film sample | 0.1-1.0 μm |
| Substrate temperature | Water cooled to 800° C. |
| Sputtering pressure | 0.3-20 mTorr |
| Sputtering power | 50-200 W |
| Heat treatment | 500 to 800° C., in vacuum, or in the atmosphere of a mixed gas of 0.1 to 1.0% $O_2$ + Ar at 30 mTorr |

For the sample of the magneto-optical material (magneto-optical thin film) produced as described above under the above conditions, the film composition was analyzed by energy dispersive spectroscopy (EDS) or wavelength dispersive spectroscopy (WDS).

Light transmittance was measured for each sample by a Fourier transform infrared spectrophotometer (FTIR). In addition, the Faraday effect (Faraday rotation angle) of each sample was measured in an optional magnetic field up to a maximum magnetic field of 800 [kA/m] for light in the wavelength region of 405 to 1550 [nm]. Furthermore, the magnetization of each sample was measured by a vibrating sample magnetization measuring device (VSM). In addition, the structure of each sample was analyzed by X-ray diffraction (XRD).

Table 2 shows the measurement result of the Faraday rotation angle in the heat treatment condition and in zero magnetic field at a wavelength of 1550 [nm] for each sample.

TABLE 2

| Sample number | Sample composition | Heat treatment condition | Absolute value of Faraday rotation angle (1550 nm) |
|---|---|---|---|
| 1 | $Co_{20}Pt_5Mg_{27}F_{48}$ | 600° C. × 1 h (in vacuum) | 0.26 (deg./μm) |
| 2 | $Co_{11}Pt_4Ca_{25}F_{60}$ | 600° C. × 1 h (in vacuum) | 0.21 (deg./μm) |
| 3 | $Fe_6Co_4Pt_{11}Mg_{25}F_{54}$ | 650° C. × 1 h (in vacuum) | 0.17 (deg./μm) |
| 4 | $Fe_8Co_5Pt_{14}Ba_{22}F_{52}$ | 600° C. × 1 h (in vacuum) | 0.11 (deg./μm) |
| 5 | $Fe_8Co_5Ba_{13}F_{46}O_{28}$ | 600° C. × 1 h (Ar + 1% $O_2$ (30 mTorr)) | 0.3 (deg./μm) |
| 6 | $Fe_{10}Pt_{10}Ba_{24}Ca_8F_{48}$ | 550° C. × 1 h (in vacuum) | 0.2 (deg./μm) |
| 7 | $Co_{19}Pt_8Mg_{15}Sr_{10}F_{48}$ | 500° C. × 1 h (in vacuum) | 0.2 (deg./μm) |
| 8 | $F_{18}Co_{13}Ca_{22}F_{25}O_{22}$ | 700° C. × 1 h (Ar + 0.1% $O_2$ (30 mTorr)) | 0.1 (deg./μm) |
| 9 | $Fe_{15}Co_9Ni_6Al_3Ca_{17}Y_5F_{45}$ | 800° C. × 1 h (in vacuum) | 0.1 (deg./μm) |
| 10 | $Fe_{14}Pt_9Mg_{20}Be_5Si_7F_{45}$ | 650° C. × 1 h (in vacuum) | 0.12 (deg./μm) |
| 11 | $Co_{10}Pt_5Ca_{18}Li_4Bi_3F_{60}$ | 600° C. × 1 h (in vacuum) | 0.08 (deg./μm) |

FIG. 1 shows Faraday loops for incident light of wavelengths 600, 800, 1310, and 1550 nm for sample 1. The Faraday loop corresponds to the magnetization curve and has hysteresis with residual magnetization and coercivity. As can be seen from FIG. 1, even though the magnetic field (H) is 0, the Faraday rotation angle has an absolute value of 0.57 [deg./μm] at 600 nm, an absolute value of 0.59 [deg./μm] at 800 nm, an absolute value of 0.33 [deg./µm] at 1310 nm, and an absolute value of 0.26 [deg./µm] at 1550 nm.

Figure 2:
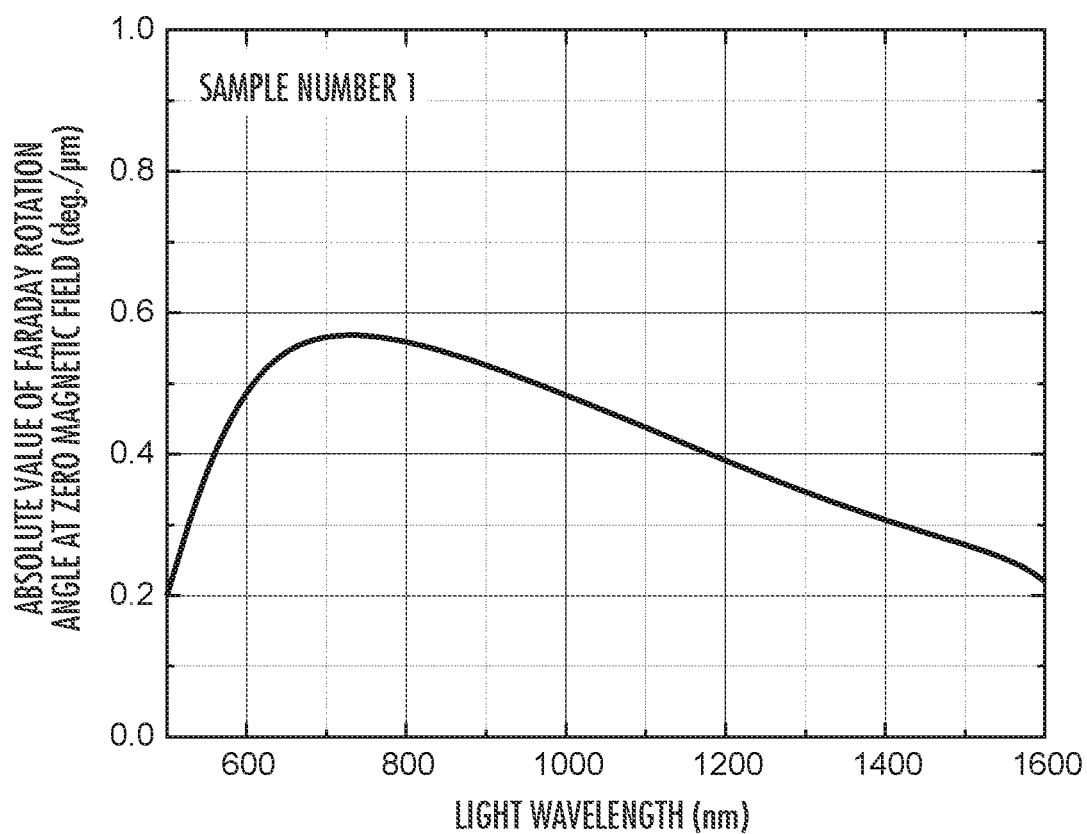
FIG. 2 shows a view of the relationship between the wavelength of light and the absolute value of the Faraday rotation angle at zero magnetic field for the sample 1.

FIG. 2 shows the relationship between the absolute value of the Faraday rotation angle and the wavelength of the incident light when no magnetic field is applied to the sample 1 (H=0). As can be seen from FIG. 2, the sample 1 has a value of 0.2 [deg./µm] or more in the wavelength region of 500 nm or more.

Figure 3:
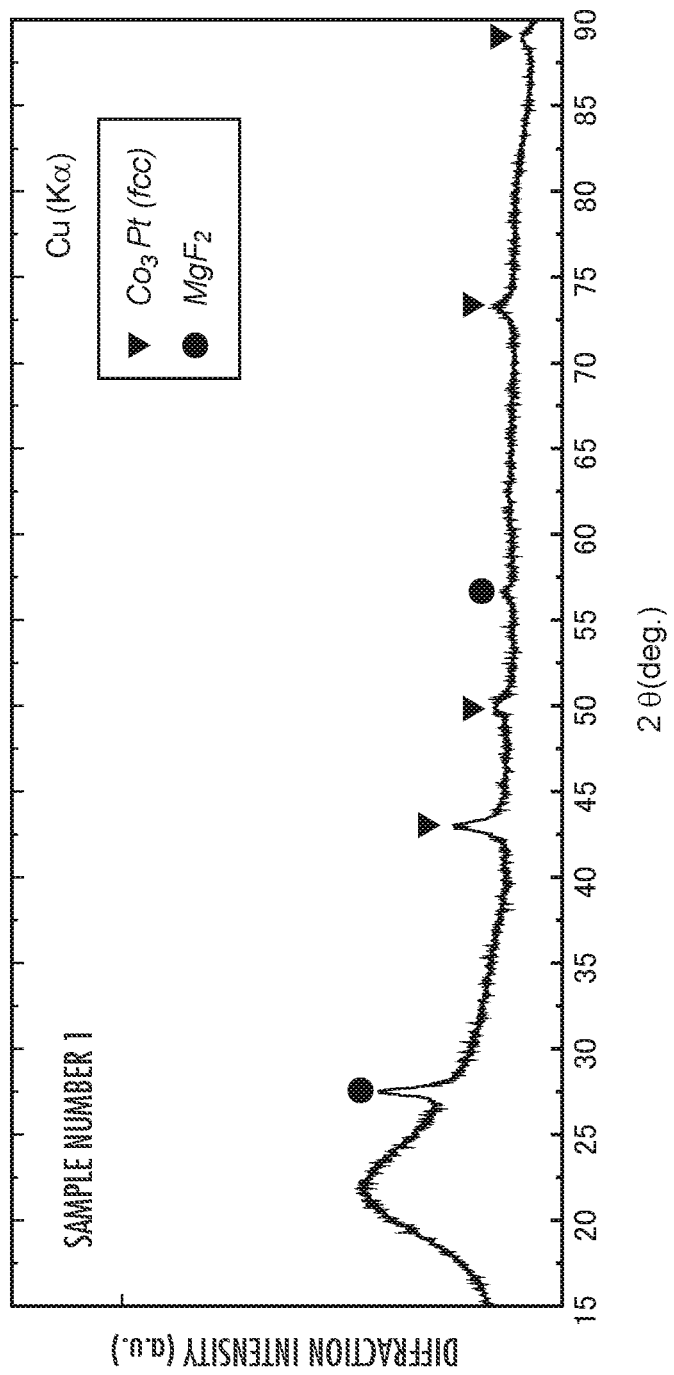
FIG. 3 shows a view of an XRD pattern of the sample 1.

FIG. 3 shows the XRD diffraction pattern of the sample 1. Heat treatment at 600° C. in vacuum after deposition promotes ordering of the Co—Pt alloy, allowing the respective peaks indicating the existence of the ordered phase of $Co_3Pt$ to be confirmed at approximately 2θ=43[deg.], 50 [deg.], 73 [deg.], and 88 [deg.]. In addition, the respective peaks indicating the existence of the $MgF_2$ phase can be confirmed at approximately 2θ=27 [deg.] and 57 [deg.]. It is found from the confirmation results that the sample 1 has a nanogranular structure in which magnet particles formed of the Co—Pt alloy of the $Co_3Pt$ ordered phase are dispersed in a matrix formed of Mg fluoride. The existence of the Co—Pt magnet particles in the sample 1 causes residual magnetization, and the magneto-optical material of the sample 1 exhibits the Faraday effect even though H=0.

Figure 4:
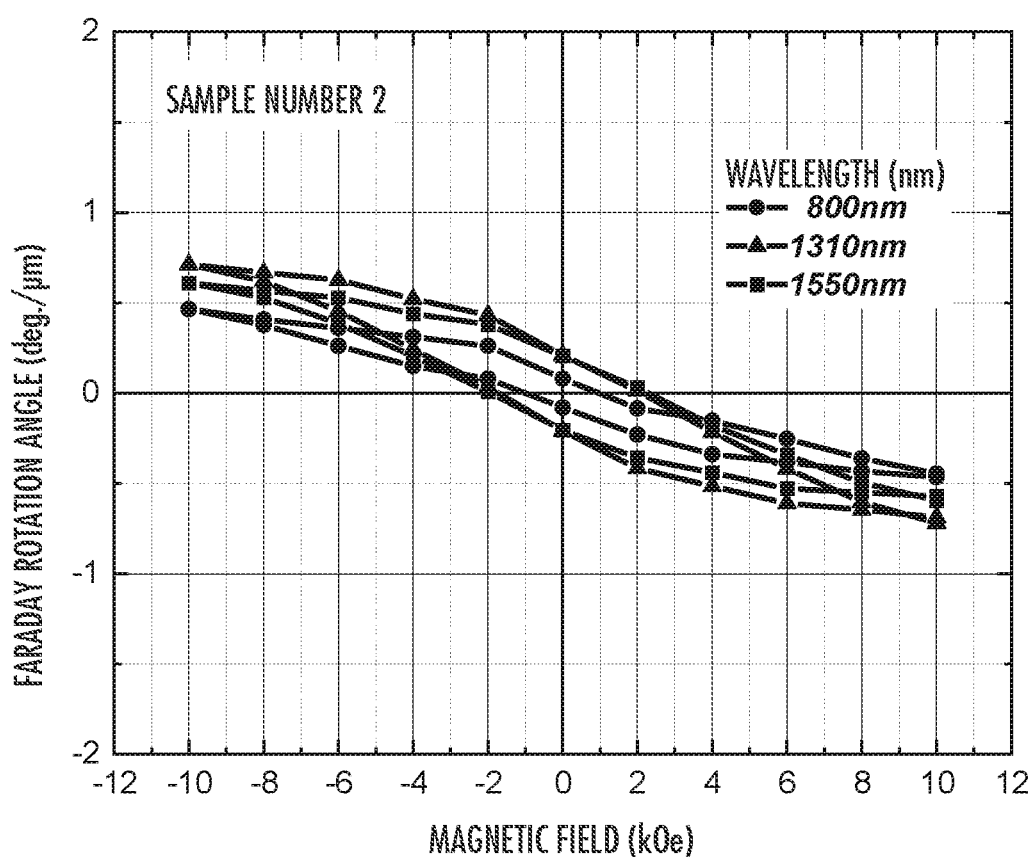
FIG. 4 shows a view of the Faraday loop of sample 2.

FIG. 4 shows Faraday loops for incident light of wavelengths 800, 1310, and 1550 [nm] for sample 2. As can be seen from FIG. 4, even though H=0, the Faraday rotation angle has an absolute value of 0.08 [deg./µm] at 800 nm, an absolute value of 0.21 [deg./µm] at 1310 nm, and an absolute value of 0.21 [deg./µm] at 1550 nm.

Figure 5:
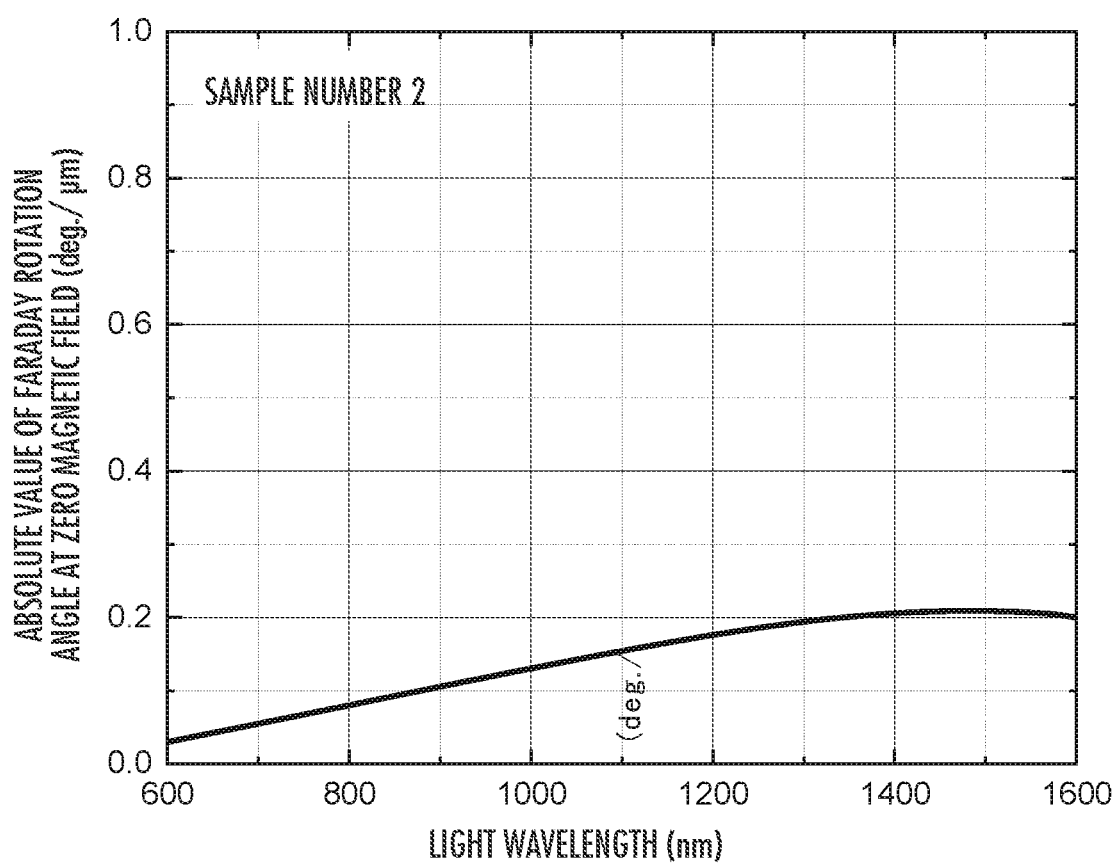
FIG. 5 shows a view of the relationship between the wavelength of light and the absolute value of the Faraday rotation angle at zero magnetic field for the sample 2.

FIG. 5 shows the relationship between the absolute value of the Faraday rotation angle and the wavelength of the incident light at H=0 for the sample 2. As can be seen from FIG. 5, the sample 2 has a value of 0.08 [deg./µm] or more in the wavelength region of 800 nm or more.

Figure 6:
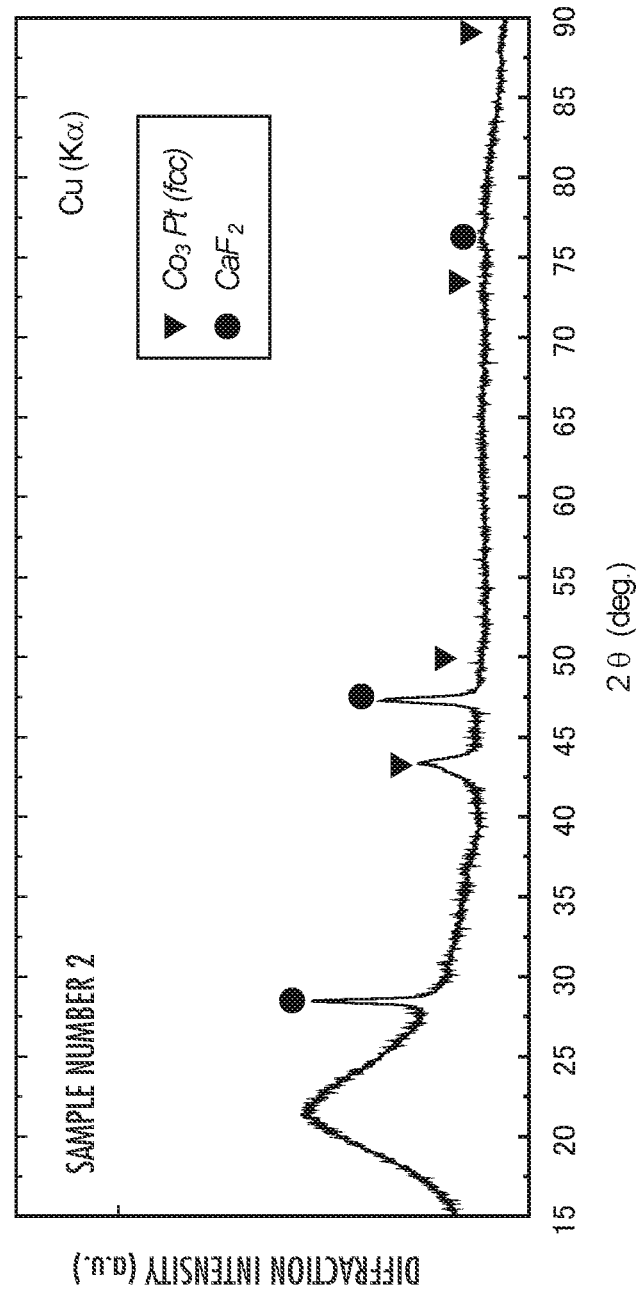
FIG. 6 shows a view of an XRD pattern of the sample 2.

FIG. 6 shows the XRD diffraction pattern of the sample 2. Heat treatment at 600° C. in vacuum after deposition promotes ordering of the Co—Pt alloy, allowing the respective peaks indicating the existence of the ordered phase of $Co_3Pt$ to be confirmed at approximately 2θ=43 [deg.], 50 [deg.], 73 [deg.], and 88 [deg.]. In addition, the respective peaks indicating the existence of the $CaF_2$ phase can be confirmed at approximately 2θ=28 [deg.], 47 [deg.], and 76 [deg.]. It is found from the confirmation results that the sample 2 has a nanogranular structure in which magnet particles formed of the Co—Pt alloy of the $Co_3Pt$ ordered phase are dispersed in a matrix formed of Ca fluoride. The existence of the Co—Pt magnet particles in the sample 2 causes residual magnetization, and the magneto-optical material of the sample 2 exhibits the Faraday effect even though H=0.

Figure 7:
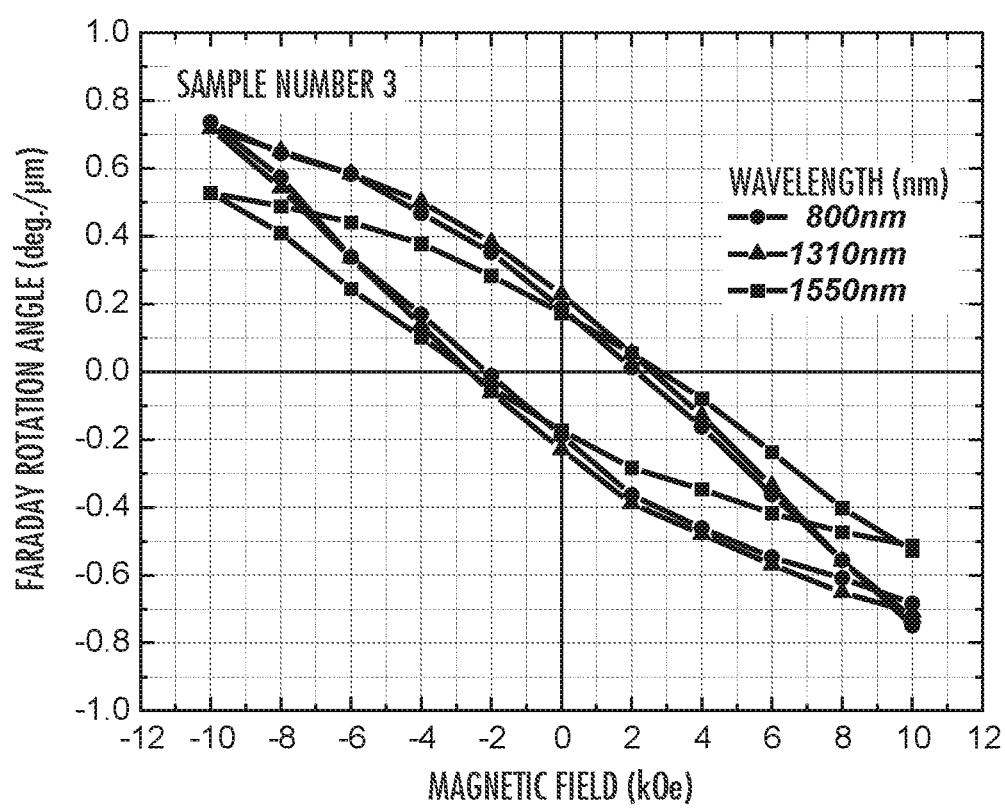
FIG. 7 shows a view of the Faraday loop of sample 3.

FIG. 7 shows Faraday loops for incident light of wavelengths 800, 1310, and 1550 [nm] for sample 3. As can be seen from FIG. 7, even though H=0, the Faraday rotation angle has an absolute value of 0.19 [deg./µm] at 800 nm, an absolute value of 0.23 [deg./µm] at 1310 nm, and an absolute value of 0.17 [deg./µm] at 1550 nm.

Figure 8:
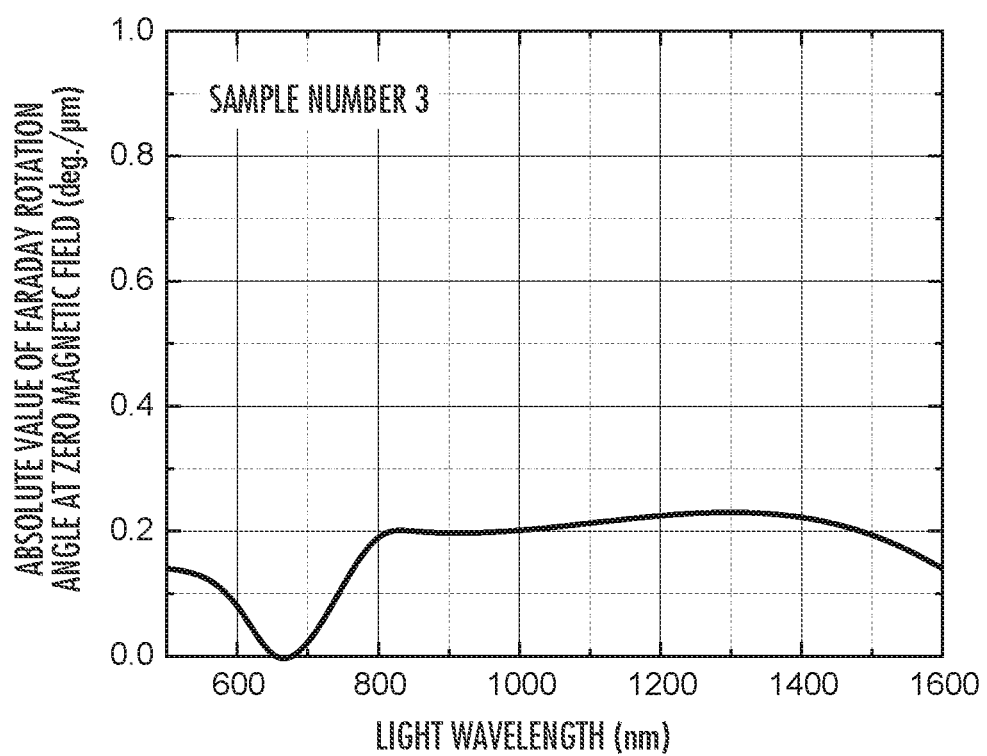
FIG. 8 shows a view of the relationship between the wavelength of light and the absolute value of the Faraday rotation angle at zero magnetic field for the sample 3.

FIG. 8 shows the relationship between the absolute value of the Faraday rotation angle and the wavelength of the incident light at H=0 for the sample 3. As can be seen from FIG. 8, the sample 3 has a value of 0.08 [deg./µm] or more in the wavelength region of 500 to 600 nm and 720 nm or more.

Figure 9:
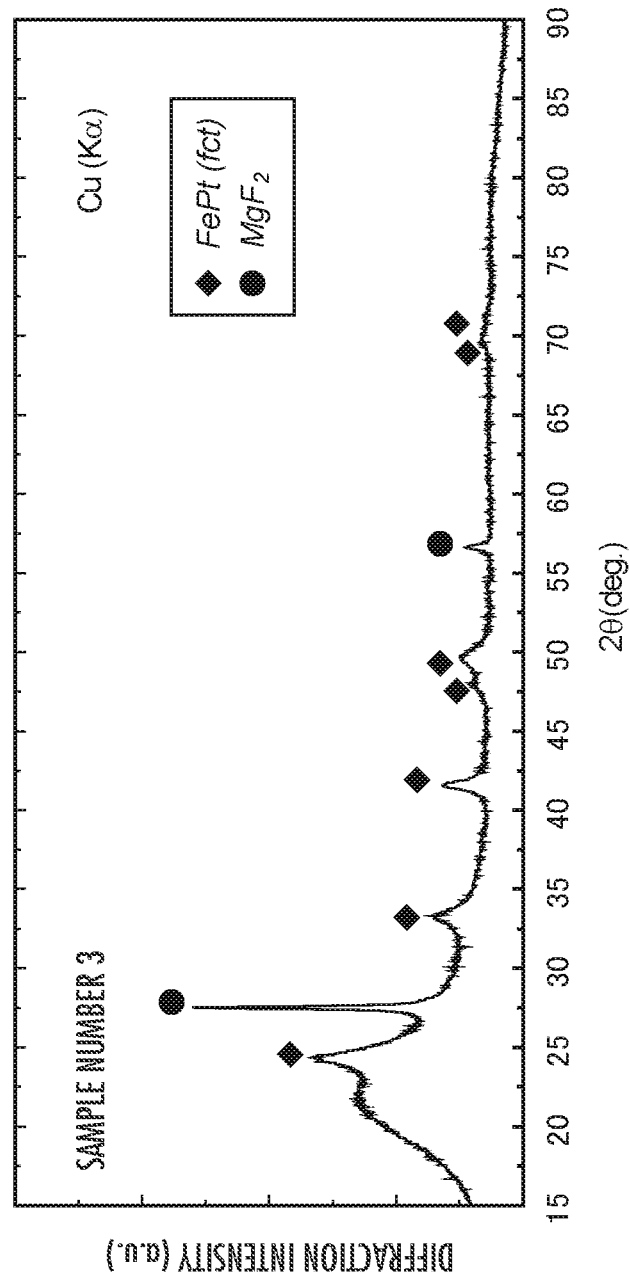
FIG. 9 shows a view of an XRD pattern of the sample 3.

FIG. 9 shows the XRD diffraction pattern of the sample 3. Heat treatment at 650° C. in vacuum after deposition promotes ordering of the Fe—Pt alloy, allowing the respective peaks indicating the existence of the ordered phase of FePt to be confirmed at approximately 2θ=24 [deg.], 33 [deg.], 42 [deg.], 47 [deg.], 49 [deg.], 68 [deg.], and 71 [deg.]. In addition, the respective peaks indicating the existence of the $MgF_2$ phase can be confirmed at approximately 2θ=28 [deg.] and 57 [deg.]. It is found from the confirmation results that the sample 3 has a nanogranular structure in which magnet particles formed of the Fe—Co—Pt alloy of the FePt ordered phase are dispersed in a matrix formed of Mg fluoride. The existence of the Fe—Co—Pt magnet particles in the sample 3 causes residual magnetization, and the magneto-optical material of the sample 3 exhibits the Faraday effect even though H=0.

Figure 10:
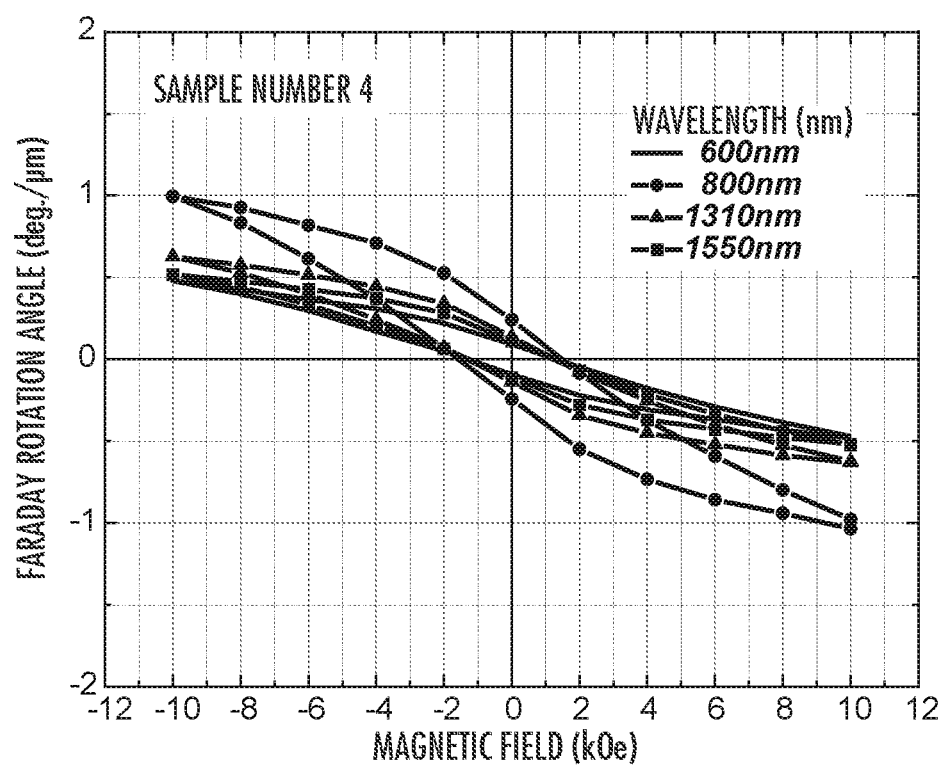
FIG. 10 shows a view of the Faraday loop of sample 4.

FIG. 10 shows Faraday loops for incident light of wavelengths 600, 800, 1310, and 1550 [nm] for sample 4. As can be seen from FIG. 10, even though H=0, the Faraday rotation angle has an absolute value of 0.09 [deg./µm] at 600 nm, an absolute value of 0.24 [deg./µm] at 800 nm, an absolute value of 0.14 [deg./µm] at 1310 nm, and an absolute value of 0.11 [deg./µm] at 1550 nm.

Figure 11:
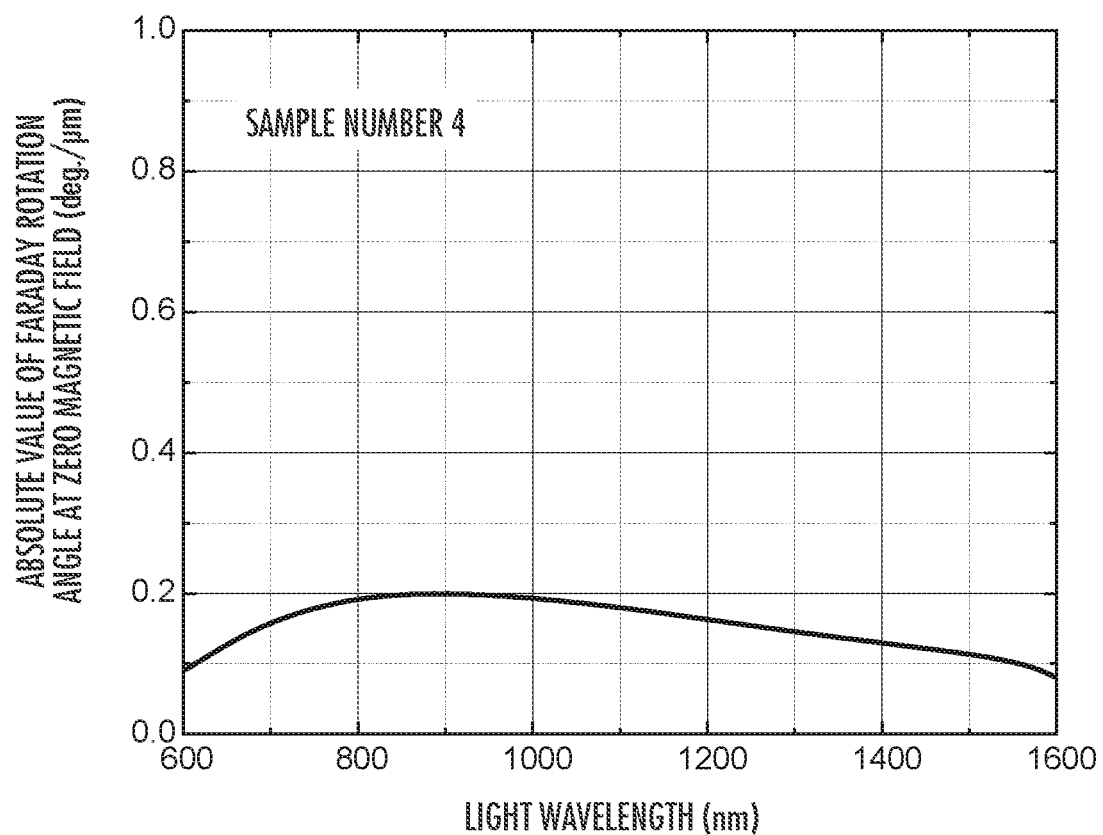
FIG. 11 shows a view of the relationship between the wavelength of light and the absolute value of the Faraday rotation angle at zero magnetic field for the sample 4.

FIG. 11 shows the relationship between the absolute value of the Faraday rotation angle and the wavelength of the incident light at H=0 for the sample 4. As can be seen from FIG. 11, the sample 4 has a value of 0.08 [deg./µm] or more in the range of 600 nm or more.

Figure 12:
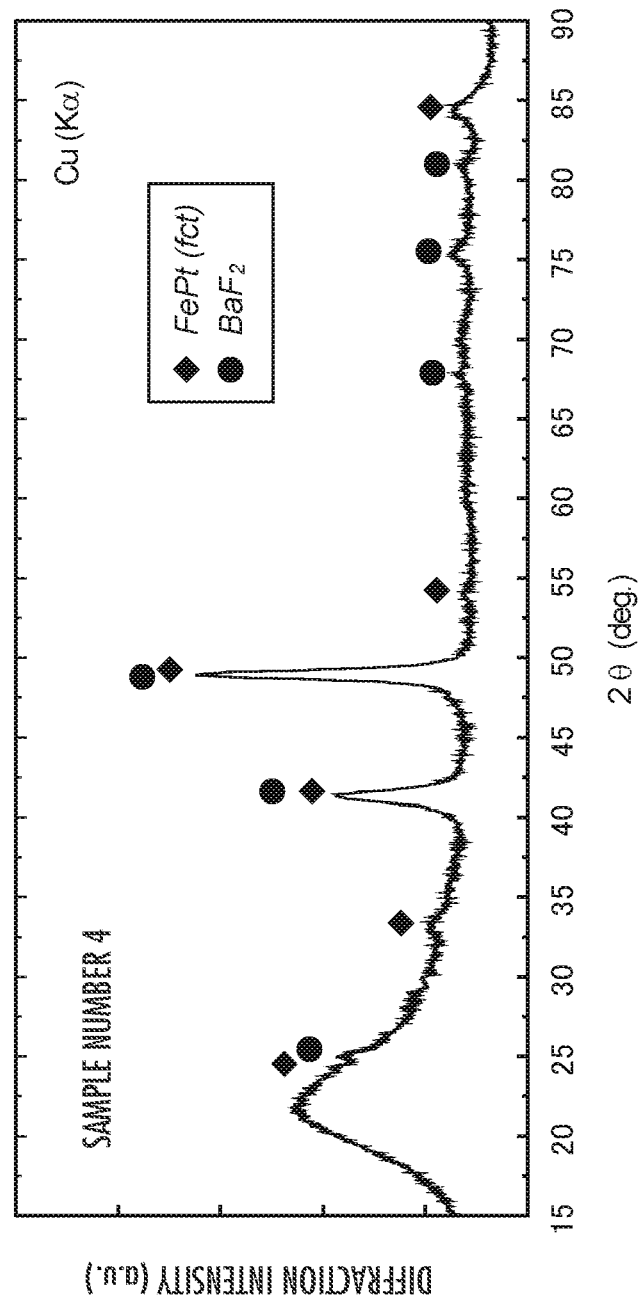
FIG. 12 shows a view of an XRD pattern of the sample 4.

FIG. 12 shows the XRD diffraction pattern of the sample 4. Heat treatment at 600° C. in vacuum after deposition promotes ordering of the Fe—Pt alloy, allowing the respective peaks indicating the existence of the ordered phase of FePt to be confirmed at approximately 2θ=24 [deg.], 33 [deg.], 42 [deg.], 47 [deg.], 58 [deg.], and 84 [deg.]. In addition, the respective peaks indicating the existence of the $BaF_2$ phase can be confirmed at approximately 2θ=25 [deg.], 42 [deg.], 48 [deg.], 67 [deg.], 75 [deg.], and 81 [deg.]. It is found from the confirmation results that the sample 4 has a nanogranular structure in which magnet particles formed of the Fe—Co—Pt alloy of the FePt ordered phase are dispersed in a matrix formed of Ba fluoride. The existence of the Fe—Co—Pt magnet particles in the sample 4 causes residual magnetization, and the magneto-optical material of the sample 4 exhibits the Faraday effect even though H=0.

Figure 13:
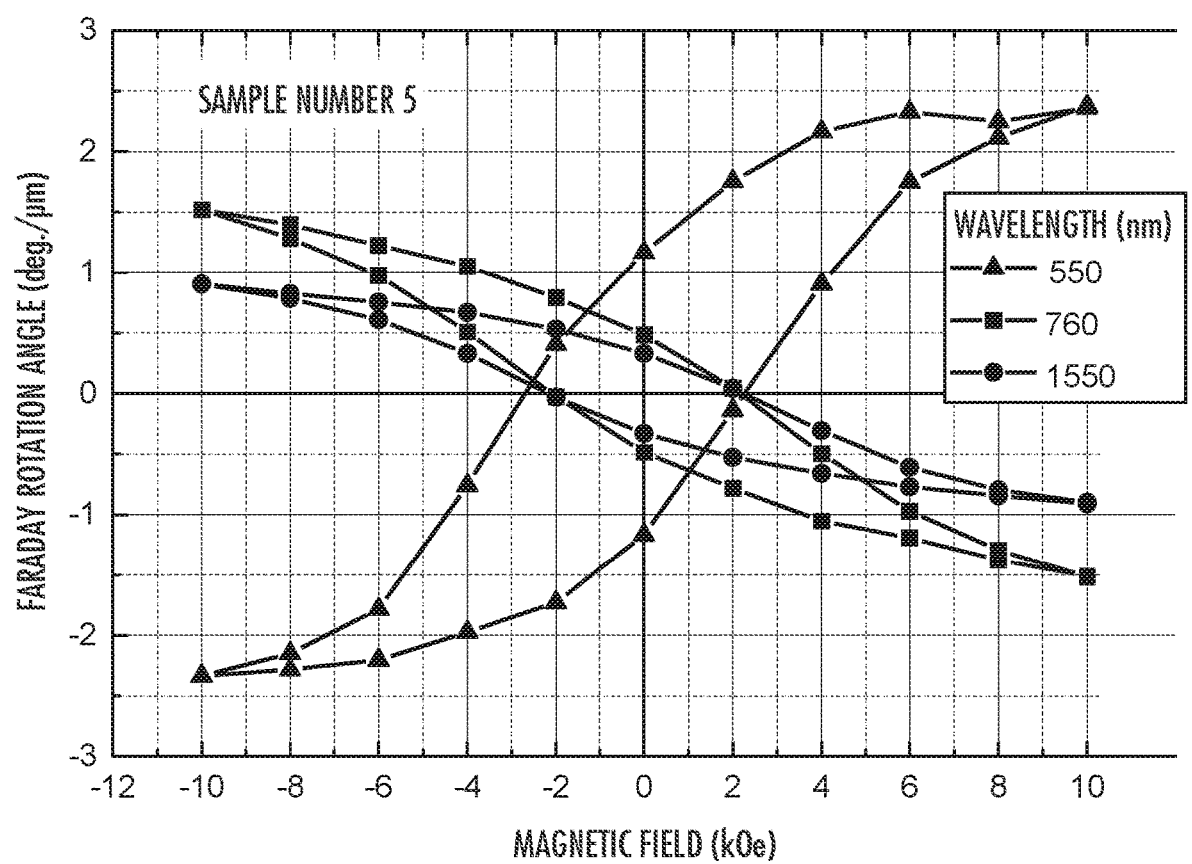
FIG. 13 shows a view of the Faraday loop of sample 5.

FIG. 13 shows Faraday loops for incident light of wavelengths 550, 760, and 1550 [nm] for sample 5. As can be seen from FIG. 13, even though H=0, the Faraday rotation angle has an absolute value of 1.2 [deg./µm] at 550 nm, an absolute value of 0.5 [deg./µm] at 760 nm, and an absolute value of 0.3 [deg./µm] at 1550 nm.

Figure 14:
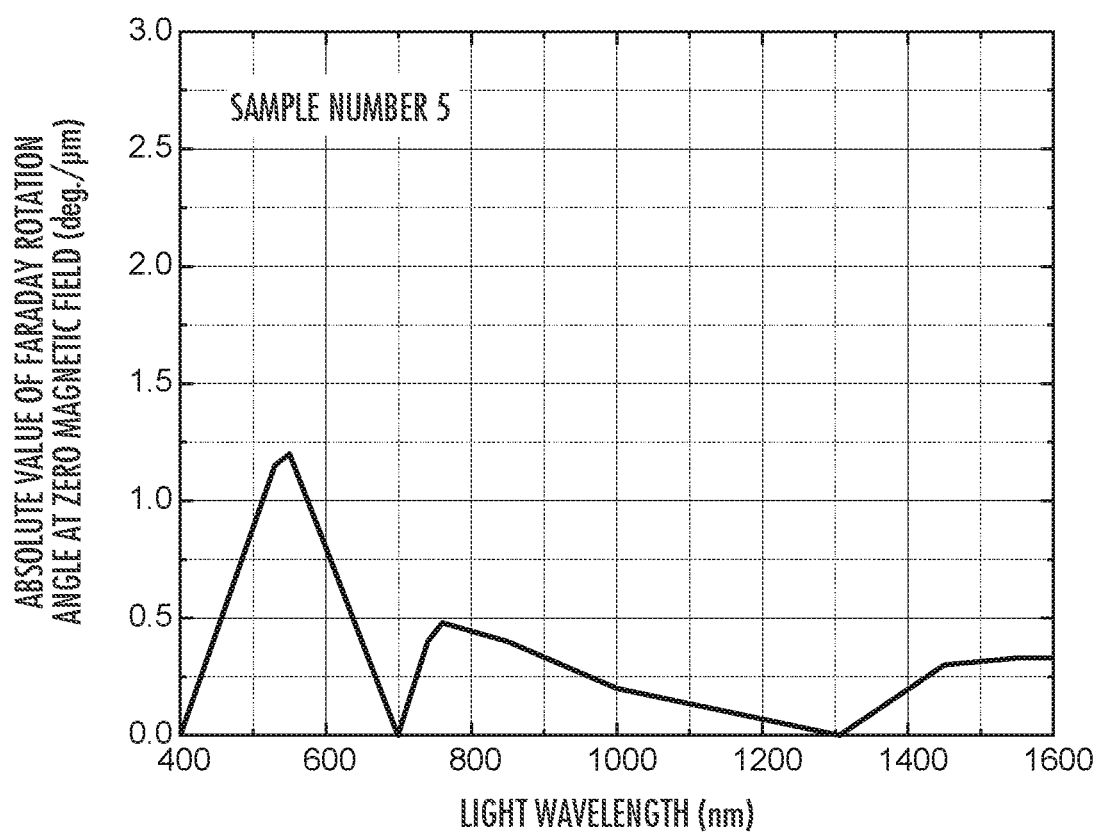
FIG. 14 shows a view of the relationship between the wavelength of light and the absolute value of the Faraday rotation angle at zero magnetic field for the sample 5.

FIG. 14 shows the relationship between the absolute value of the Faraday rotation angle and the wavelength of the incident light at H=0 for the sample 5. As can be seen from FIG. 14, the sample 5 has a value of 0.08 [deg./µm] or more in the wavelength region of 410 to 690 nm, 710 to 1180 nm, and 1330 nm or more.

Figure 15:
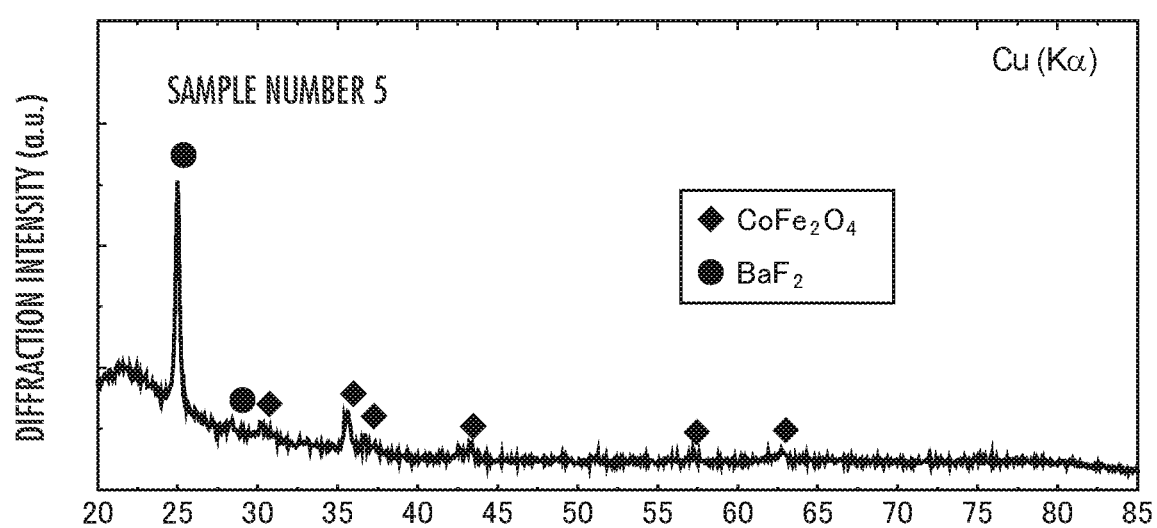
FIG. 15 shows a view of an XRD pattern of the sample 5.

FIG. 15 shows the XRD diffraction pattern of the sample 5. Nanogranules consisting of Co-ferrite magnets with spinel structures are synthesized by heat treatment in an oxygen atmosphere, and the respective peaks indicating the existence of the spinel phase of $CoFe_2O_4$ can be confirmed at approximately 2θ=31 [deg.], 35 [deg.], 37 [deg.], 43 [deg.], 53 [deg.], and 63 [deg.]. In addition, the respective peaks indicating the existence of the $BaF_2$ phase can be confirmed at approximately 2θ=25 [deg.] and 29 [deg.]. It is found from the confirmation results that the sample 5 has a nanogranular structure in which magnet particles formed of a $CoFe_2O_4$ spinel ferrite are dispersed in a matrix formed of Ba fluoride. The existence of the $CoFe_2O_4$ magnet particles in the sample 5 causes residual magnetization, and the magneto-optical material of the sample 5 exhibits the Faraday effect even though H=0.

The magneto-optical material of the present invention exhibits the Faraday effect even though no magnetic field is applied, and therefore a magnetic field application mechanism is unnecessary in device design, and simplification and/or miniaturization of the device becomes possible.

The invention claimed is:

1. A magneto-optical material, comprising a nanogranular structure in which nanoparticles are dispersed in a matrix, wherein the matrix is a fluoride matrix including at least one element selected from the group consisting of Li, Be, Mg, Al, Si, Ca, Sr, Ba, Bi, and rare earth elements, and the nanoparticles are magnetic nanoparticles having at least one magnetization selected from the group consisting of a Fe—Pt alloy, a Co—Pt alloy, a Fe—Co—Ni—Al alloy, a Co ferrite, and a Ba ferrite, and including a Fe—Pt ordered phase, a $Co_3$—Pt ordered phase, or a spinel phase, a light transmittance for incident light in a wavelength band of 400 nm to 2000 nm is within a range of 1 [%/μm] or more, and an absolute value of Faraday rotation angle accompanied by residual magnetization is 0.2 [deg./μm] or more for light in at least a part of a wavelength band of 600 nm to 1600 nm in a state of no magnetic field applied.

2. The magneto-optical material according to claim 1, wherein a volume ratio of all of the magnetic nanoparticles included in the nanogranular structure to the matrix is 10% or more and 50% or less.

3. A method for producing the magneto-optical material according to claim 1, the method comprising:

a step of producing a nanogranular material having a nanogranular structure in which the magnetic nanoparticles are dispersed in the fluoride matrix; and a step of heat-treating the nanogranular material in a temperature range in which the magnetic nanoparticles are ordered.

* * * * *